United States Patent
Murakami et al.

(10) Patent No.: US 6,633,362 B2
(45) Date of Patent: Oct. 14, 2003

(54) PROJECTION EXPOSURE APPARATUS

(75) Inventors: Eiichi Murakami, Utsunomiya (JP); Osamu Kakuchi, Utsunomiya (JP)

(73) Assignee: Canon Kabushiki Kaisha, Tokyo (JP)

( * ) Notice: Subject to any disclaimer, the term of this patent is extended or adjusted under 35 U.S.C. 154(b) by 0 days.

(21) Appl. No.: 09/533,377

(22) Filed: Mar. 22, 2000

(65) Prior Publication Data
US 2003/0128346 A1 Jul. 10, 2003

(30) Foreign Application Priority Data
Mar. 24, 1999 (JP) .......................... 11-079285

(51) Int. Cl.$^7$ .......................... G03B 27/42; G03B 9/02; G01B 9/02
(52) U.S. Cl. .......................... 355/53; 356/450
(58) Field of Search .......................... 355/52, 53, 55, 355/67; 356/450, 511

(56) References Cited
U.S. PATENT DOCUMENTS

| | | | | |
|---|---|---|---|---|
| 5,270,771 A | 12/1993 | Sato | ............ | 355/53 |
| 5,381,210 A * | 1/1995 | Hagiwara | ............ | 250/548 |
| 5,801,815 A * | 9/1998 | Takahashi | ............ | 355/30 |
| 5,805,273 A * | 9/1998 | Unno | ............ | 355/30 |
| 5,898,501 A * | 4/1999 | Suzuki et al. | ............ | 356/511 |
| 6,278,514 B1 * | 8/2001 | Ohsaki | ............ | 355/53 |
| 6,281,966 B1 * | 8/2001 | Kenmoku | ............ | 355/53 |

* cited by examiner

Primary Examiner—Rodney Fuller
(74) Attorney, Agent, or Firm—Fitzpatrick, Cella, Harper & Scinto (57) ABSTRACT

A projection exposure apparatus includes an illumination optical system for illuminating a pattern formed on a first object, with light, a projection optical system for projecting the pattern of the first object, illuminated by the illumination optical system, onto a second object for exposure of the same with the pattern, a main system including the illumination optical system and the projection optical system, and an interferometer for use in measurement of an optical characteristic of the projection optical system and being mounted on the main system.

21 Claims, 5 Drawing Sheets

PROJECTION EXPOSURE APPARATUS

FIELD OF THE INVENTION AND RELATED ART

This invention relates to a projection exposure apparatus for semiconductor manufacture and, more particularly, to a projection exposure apparatus for semiconductor manufacture which is usable in a lithographic process for the production of semiconductor devices or liquid crystal display devices, for example.

The density of an integrated circuit is increasing, and thus, projection exposure apparatuses for semiconductor manufacture should have a very high resolving power for projection exposure of a wafer to a circuit pattern formed on a reticle. In projection optical systems of such projection exposure apparatuses, for improvement of the resolution, the numerical aperture (NA) has been enlarged or light of shorter wavelengths has been used. At present, with a projection exposure apparatus having a light source of a KrF excimer laser ($\lambda$=248 nm) and NA of 0.6, a resolution of 0.18 micron is attainable.

Recently, super-resolution exposure techniques based on modified illumination such as ring-zone illumination or quadrupole illumination have been proposed. A resolution of 0.15–0.1 micron may be attainable with them.

For production of a high resolution projection optical system, it is necessary to perform precise adjustment after a projection optical system is assembled. More specifically, for a projection optical system, optical evaluations in regard to spherical aberration, coma, distortion, and exposure magnification, for example, should be done. While adjusting lens group spacings or eccentricities, the optical performance that satisfies predetermined specifications is pursued. Usually, the evaluation of optical performance is made by projecting and printing an image of a mask pattern upon a resist (photosensitive material) applied to a photosensitive substrate (wafer) and by observing, after development, a resist image formed thereon.

As an alternative method, there is a method in which wavefront aberration of a projection optical system is measured by use of an interferometer. However, this method requires use of a special apparatus.

As described above, in projection exposure apparatuses, it is necessary to check the quality of a resist image for final lens performance adjustment of a projection optical system. However, this procedure involves very complicated processes such as printing a pattern on a resist-coated wafer, developing the wafer, and observing a resist image by use of a scan type electron microscope (SEM).

Additionally, since, after the optical adjustment and evaluation, a projection optical system should be mounted on a projection exposure apparatus with its lenses and lens groups held fixed so that the performance does not change, it is very difficult to adjust a projection exposure optical system once the projection optical system is incorporated into the projection exposure apparatus. Practically, however, in wafer exposure processes, the projection optical system is influenced by irradiation with illumination light and the image performance thereof changes thereby.

Conventional projection exposure apparatuses are not equipped with any effective means for measuring wavefront aberration of a projection optical system after the same is mounted on the projection exposure apparatus. The goal for re-adjustment for image performance is, therefore, unfixed, and usually, the operation is interrupted to suppress the change.

SUMMARY OF THE INVENTION

It is accordingly an object of the present invention to provide a projection exposure apparatus by which measurement of image performance of a projection optical system, being mounted on the projection exposure apparatus, can be done easily.

These and other objects, features and advantages of the present invention will become more apparent upon a consideration of the following description of the preferred embodiments of the present invention taken in conjunction with the accompanying drawings.

DESCRIPTION OF THE PREFERRED EMBODIMENTS

In some preferred embodiments of the present invention to be described below, a main assembly of a projection exposure apparatus is equipped with an interferometer for measurement of an optical performance of a projection optical system, by which wavefront measurement for the projection optical system can be done directly upon the main assembly of the projection exposure apparatus.

Figure 1:
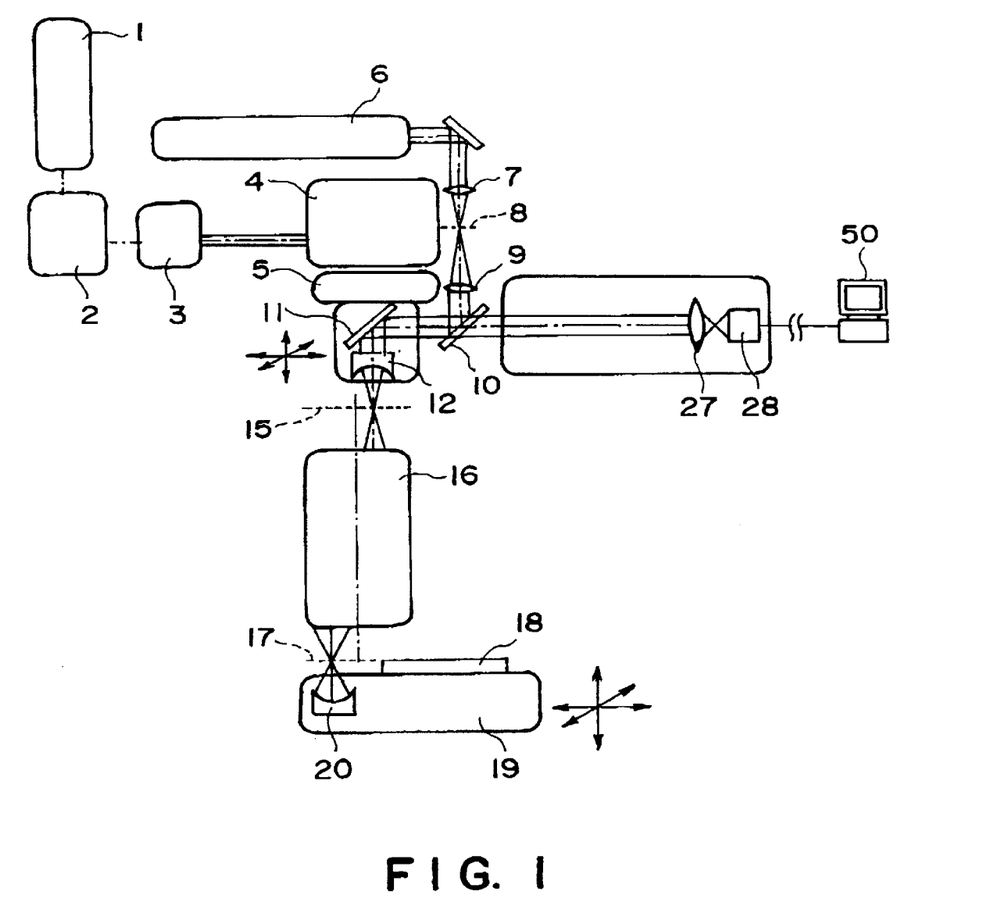
FIG. 1 is a schematic view of a projection exposure apparatus according to a first embodiment of the present invention.

FIG. 1 is a schematic view of a projection exposure apparatus according to a first embodiment of the present invention. In this embodiment, the invention is applied to an excimer laser stepper having an exposure wavelength of 248 nm.

Denoted in the drawing at 1 is a KrF excimer laser which is a light source for exposure (lithography). Light emitted from the light source 1 enters a beam shaping optical system 2 by which it is shaped into a beam shape being symmetrical with respect to an optical axis. Through an incoherency transforming unit 3, the coherent length of the light is reduced. Then, the light goes through an illumination optical system 4, and it illuminates a reticle 15. The reticle 15 has a desired pattern formed thereon. The reticle pattern is then projected by a projection optical system 16 and is imaged at a position 17. Denoted at 18 is a chuck for carrying a wafer thereon. It is fixedly mounted on a stage. In addition to these components, the projection exposure apparatus includes an alignment detection optical system, a focus detection system and so on, all constituting a main system. They are not illustrated in FIG. 1, for simplification of the illustration.

Next, the structure of an interferometer for measurement of the wavefront of a projection optical system, will be described. Here, the arrangement shown in FIG. 1 is an example wherein a Fizeau type interferometer is provided at the reticle side.

In a case where the exposure light source comprises an excimer laser, usually, the coherent length is about several tens of millimeters, whereas the total length of a projection optical system, which is the subject of measurement, is about 1,000 millimeters. For this reason, it is practically unable to provide a Fizeau type interferometer. In consideration of it, in this embodiment, a light source separate from the exposure light source is used exclusively for an interferometer for measurement of the wavefront of the projection optical system.

Denoted in the drawing at 6 is the light source to be used exclusively with the interferometer. Since the exposure wavelength is 248 nm in this embodiment, a light beam of 248 nm, corresponding to a second harmonic of an Ar laser is used. The Ar laser beam goes via a mirror and then through a condenser system 7 and a pinhole 8. By means of a collimator lens 9, the laser beam is transformed into a parallel beam. The diameter of the pinhole 8 is set as approximately the same as an Airy disc determined by the numerical aperture of the collimator lens 9. Therefore, the light beam emitted from the pinhole 8 comprises a substantially idealistically spherical wave. Since the collimator lens 9 is designed and produced substantially free from aberration, it can be considered that the light emitted from the collimator lens 9 comprises an idealistically plane wave. In the structure of FIG. 1, the light from the light source 1 may be guided to the pinhole 8 by use of a polarization plane preserving fiber.

The thus produced parallel beam goes via a half mirror 10 and a mirror 11, and it enters a lens 12 which is what can be called a TS lens (Fizeau lens) wherein the final face functions as a reference surface. The mirror 11 and the lens 12 are held by an X-Y-Z stage 5.

Usually, steppers include a reticle-to-wafer aligning means which may comprise a TTR alignment scope for detecting the wafer position through the reticle, and such an alignment scope may be mounted on and held by a moving mechanism for moving the TTR alignment scope to a desired position on the reticle. In this embodiment, such a TTR alignment scope is used also as the interferometer objective lens 12 described above.

The interferometer objective lens 12 should be retracted out of the path of exposure light of the projection optical system 16 in the exposure process, while on the other hand, it should be moved onto the light path of the projection optical system for measurement of the wavefront aberration. When the TTR alignment scope is used as the detection optical system as described, since the TTR alignment scope can be moved to any desired position upon a reticle, wavefront measurement can be done with respect to plural points on the picture field in the exposure region.

The curvature radius of the final face of the objective lens 12, at the reticle side thereof, is equal to the distance to the position 15 which is equivalent to the pattern surface of the reticle. Thus, reflection light from that final face is directed, as reference light, to a light receiving surface of a CCD 28 through the mirror 11, half mirror 10 and a condensing system 27.

On the other hand, the light beam passed through the objective lens 12 is imaged at the position 15, corresponding to the reticle pattern position, and then it is imaged again by the projection optical system 16 at a position 17 which is at the wafer side thereof. There is a spherical surface mirror 20 disposed on the stage 19, and the curvature radius of the spherical mirror 20 is made equal to the distance from the imaging position 17 of the projection optical system. Thus, the light reflected by the spherical mirror 20 is collected again at the imaging position 17 of the projection optical system, and it goes again through the projection optical system, the objective lens 12, the mirror 11 and the half mirror 10. The light then passes the condensing system 27, and it is directed to the light receiving surface of the CCD 28. Since the light beam passing through the projection optical system 16 interferes with the reference beam as reflected by the final face of the objective lens 12 as described above, the wavefront of the projection optical system can be measured, on the basis of it. Thus, by analyzing the outputs of the CCD 28 in a work station 50, annexed to the exposure apparatus, wavefront aberration as well as various aberrations of the projection optical system 16 such as wavefront aberration and field curvature, for example, causing the wavefront aberration, can be measured.

The spherical mirror 20 comprises a concave surface mirror in this example. However, a spherical mirror having a convex surface mirror may be used to provide an interferometer system. On that occasion, the curvature center position of the convex surface mirror should be registered with the imaging position 17, and the mirror should be placed at an opposite side as compared with the concave surface mirror. As a further alternative, a plane surface mirror (or a wafer surface in substitution therefor) may be used. On that occasion, with vertex reflection, only a revolutionally symmetrical component of wavefront aberration can be detected.

Any error in relation to the wavefront which is involved in the interferometer itself, such as the final face of the objective lens 12 or the spherical mirror 20, for example, should be distinguished from the wavefront aberration of the projection optical system 16 to be examined. To this end, it is necessary to measure the wavefront beforehand, in accordance with a system error measuring method. The wavefront of the projection optical system 16 can be measured exactly, by correcting the wavefront error while subtracting it from the measurement results for the projection optical system 16.

For further enhancement of measurement precision, the measurement through the interferometer may be performed in accordance with a fringe scan method. The fringe scan can be accomplished by actuating a PZT device (not shown) inside the wafer stage 19 to shift the mirror 20 in the optical axis direction by an amount of about the wavelength, to perform phase modulation of the wavefront. In this connection, moving means which is provided for focus adjustment of the projection exposure apparatus may be used as the moving means for moving the spherical mirror 20 in the optical axis direction.

From the measurement of the wavefront of the projection optical system, information regarding the wavefront aberration at a measurement point is obtainable. Further, a revolutionally symmetrical component and a revolutionally asymmetrical component of the wavefront aberration as obtained through the measurement of the wavefront of the projection optical system 16 as well as the X-Y-Z coordinates of the objective lens 12 and the spherical mirror 20 as obtained from a measuring device during the wavefront measurement may be combined with each other, by which interrelationship among the measurement points of the projection optical system, can be determined.

The field curvature of the projection optical system can be detected by measuring the wavefront of the projection optical system with respect to plural points within the picture plane. More specifically, once the coordinate position of the detection optical system of the interferometer upon the wavefront measurement, the wavefront as measured by the interferometer, and the coordinate position of the spherical mirror 20 with respect to the optical axis direction of the projection optical system 16 are determined, the field curvature can be calculated from the information related to the plural points. The component of wavefront aberration which is very important in regard to calculation of the field curvature is the revolutionally symmetrical power component (defocus component) of the measured wavefront.

Distortion of the projection optical system can also be detected by measuring the wavefront of the projection optical system with respect to plural points within the picture plane. More specifically, once the coordinate position of the detection optical system of the interferometer upon the wavefront measurement, the wavefront as measured by the interferometer, and the coordinate position of the spherical mirror 20 with respect to a direction orthogonal to the optical axis of the projection optical system 16 are determined, distortion of the projection optical system 16 can be calculated from the information related to the plural points. The component of the wavefront aberration which is very important in regard to calculation of distortion is the revolutionally asymmetrical component (tilt component) of the measured wavefront.

On the basis of the results of measurement, a predetermined lens or lenses of the projection optical system 16 may be displaced, by which the aberration of the projection optical system can be adjusted and controlled into a desired state.

Figure 2:
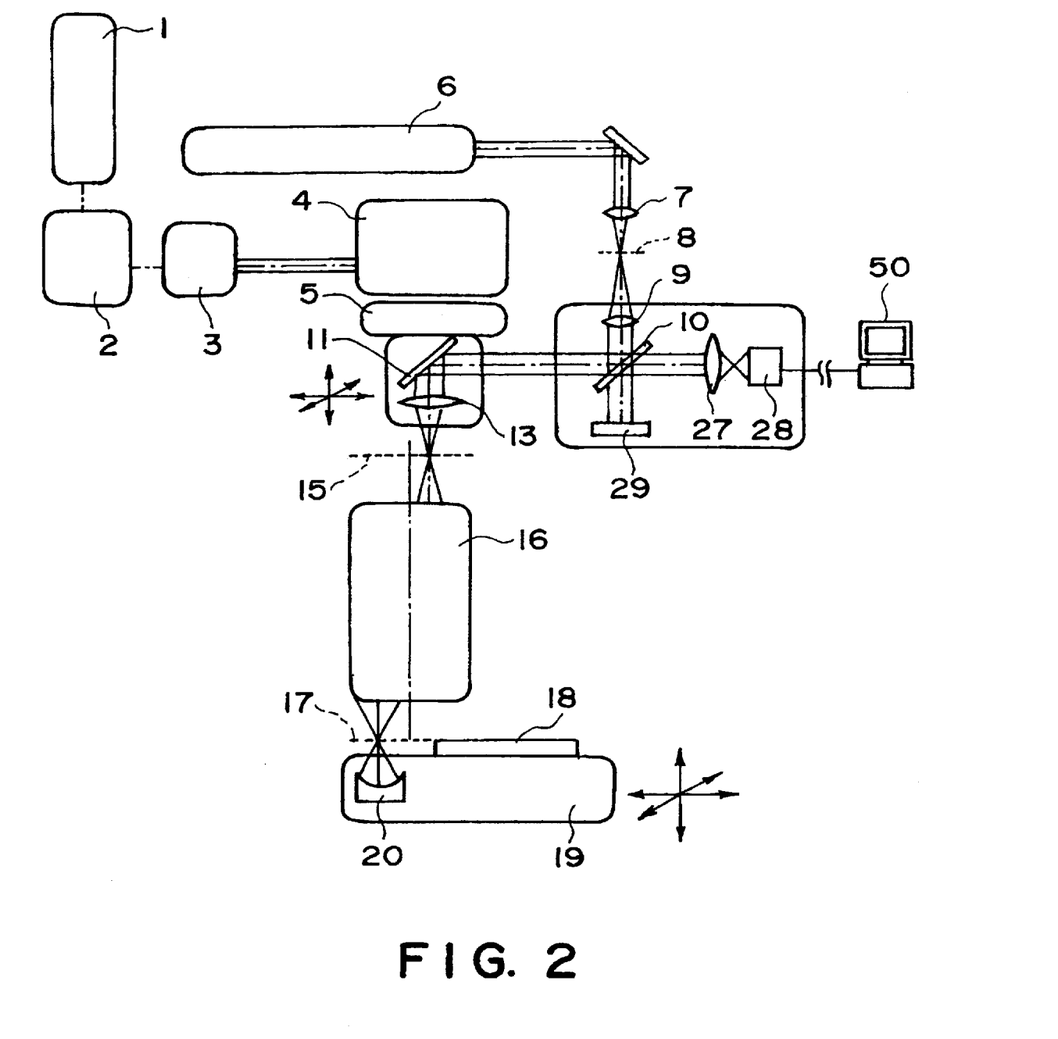
FIG. 2 is a schematic view of a projection exposure apparatus according to a second embodiment of the present invention.

FIG. 2 is a schematic view of a second embodiment of the present invention. Like the first embodiment, in this embodiment, the invention is applied to an excimer laser stepper having an exposure wavelength of 248 nm. In this embodiment, a Twyman-Green type interferometer is provided on the reticle side.

Denoted at 6 is a light source for the interferometer, from which a light beam of 248 nm corresponding to the second harmonic of an Ar laser is extracted. The laser beam goes via a mirror, a condensing system 7 and a pinhole 8. Through an optical system 9, it is transformed into a parallel beam. The parallel light beam is then divided by a half mirror 10 into two light beams. The light beam passing through the half mirror 10 is reflected by a mirror 29 as a reference beam, and the reflected light beam is then reflected by the half mirror 10. After being reflected, the light beam passes through a condensing system 27 and it impinges on a light receiving surface of a CCD 28.

On the other hand, the light beam reflected by the half mirror 10 goes via a mirror 11, and it enters an objective lens 13. The light beam passing through the objective lens 13 is once imaged at a position 15 corresponding to the reticle pattern position, and then it is re-imaged by the projection optical system 16 at a position 17 on the wafer side. There is a stage 19 on which a spherical surface mirror 20 is mounted. The mirror has a curvature radius which corresponds to the distance from the imaging position 17 of the projection optical system. Thus, the light reflected by the spherical mirror 20 is collected again at the imaging position of the projection optical system. Then, it goes back through the projection optical system 16 and passes via the objective lens 13, the mirror 11, the half mirror 10 and the condensing system 27. Finally, it impinges on the light receiving surface of the CCD 28. The light beam passing through the projection optical system 16 interferes with the reference beam described above, such that the wavefront of the projection optical system can be measured.

For the correction of a system error in the measured wavefront, use of a fringe scan method for enhancement of measurement precision, use of a spherical mirror of a convex surface mirror type, and calculation of aberrations of the projection optical system may be done in a similar way as in the first embodiment. On the basis of the results of these measurements, a predetermined lens or lenses of the projection optical system 16 may be displaced, by which the aberrations of the projection optical system can be adjusted and controlled into a desired state.

Figure 3:
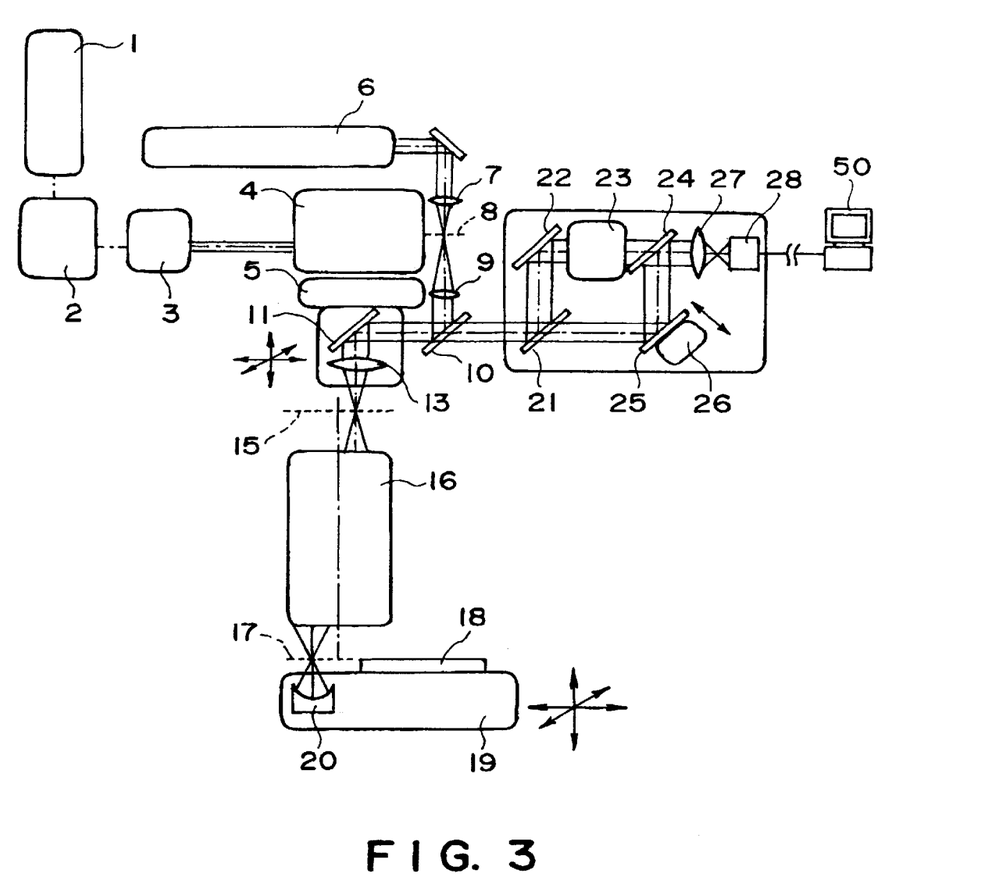
FIG. 3 is a schematic view of a projection exposure apparatus according to a third embodiment of the present invention.

FIG. 3 is a schematic view of a third embodiment of the present invention. Like the first embodiment, this embodiment is directed to an excimer laser stepper having an exposure wavelength of 248 nm. In this embodiment, a radial share type interferometer is provided on the reticle side.

Denoted at 6 is a light source for the interferometer, from which a light beam of 248 nm corresponding to the second harmonic of an Ar laser is extracted. The laser beam goes via a mirror, a condensing system 7 and a pinhole 8. Through an optical system 9, it is transformed into a parallel beam. The parallel light beam is then reflected by a half mirror 10, and it is directed via a mirror 11 to an objective lens 13. The light beam passing through the object lens 13 is imaged at a position 15 corresponding to the reticle pattern position, and then it is imaged again by the projection optical system 16 at a position 17 on the wafer side. There is a stage 19 on which a spherical surface mirror 20 is mounted. The spherical mirror 20 has a curvature radius which corresponds to the distance from the imaging position 17 of the projection optical system. Thus, the light reflected by the spherical mirror 20 is collected again at the imaging position 17 of the projection optical system, and it goes back through the projection optical system. Then, it advances via the objective lens 13, the mirror 11 and the half mirror 10, and it is introduced into an interferometer having components denoted by numerals 21–28.

The light beam introduced into the interferometer is divided by a 1:1 half mirror 21 into two light beams. The reflected light beam goes via a mirror 22 and then it is expanded by a beam expander 23. The expansion magnification may generally be 10× or more. Because of the expansion, the light beam can be considered as being an approximately idealistic plane wave. Thus, as a reference beam, it is directed to a light receiving surface of a CCD 28, via a half mirror 24 and a condensing system 27.

On the other hand, the light beam passed through the half mirror 21 goes via a mirror 25 as a measurement beam, and it is reflected by a half mirror 24, by which it is combined with the reference beam. The light beam is then passed through the condensing system 27 and it is directed onto the light receiving surface of the CCD 28. Here, it is to be noted that, for fine adjustment of the interferometer, the mirror 25 is mounted on a mechanism 26 by which tilt and parallel eccentricity can be adjusted. The measurement beam described above interfere with the reference beam described above, by which the wavefront of the projection optical system 16 can be measured.

For the correction of a system error in the measured wavefront, use of a fringe scan method for enhancement of measurement precision, use of a spherical mirror of convex surface mirror type, and calculation of aberrations of the projection optical system may be done in a similar way as in the first embodiment. On the basis of the results of these measurements, a predetermined lens or lenses of the projection optical system 16 may be displaced, by which the aberrations of the projection optical system can be adjusted and controlled into a desired state.

Figure 4:
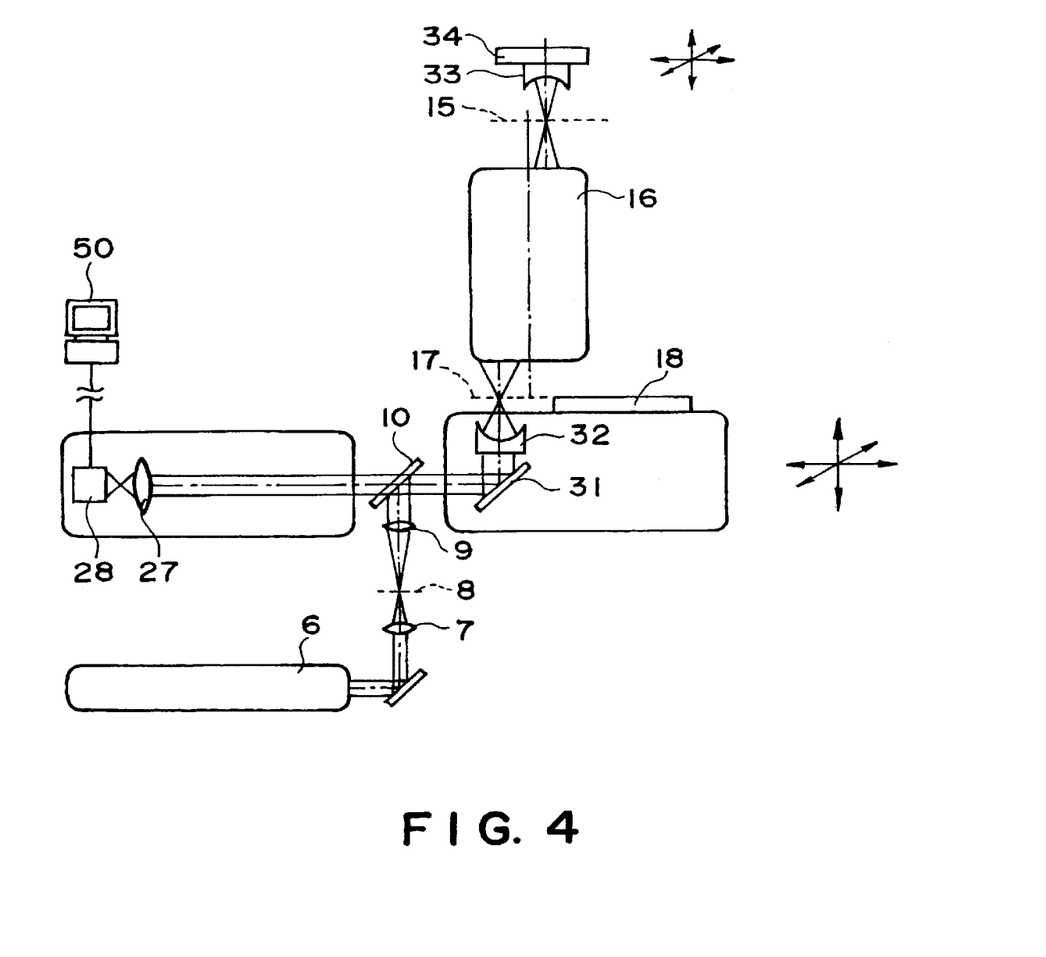
FIG. 4 is a schematic view of a projection exposure apparatus according to a fourth embodiment of the present invention.

FIG. 4 is a schematic view of a fourth embodiment of the present invention. Like the first embodiment, this embodiment is directed to an excimer laser stepper having an exposure wavelength of 248 nm, wherein a Fizeau type interferometer is provided on the wafer side.

Denoted at 6 is a light source for the interferometer, from which a light beam of 248 nm corresponding to the second harmonic of an Ar laser is extracted. The laser beam goes via a mirror, a condensing system 7 and pinhole 8. Through an optical system 9, it is transformed into a parallel beam. The parallel light beam then goes via a half mirror 10 and a mirror 11, and it enters an objective lens 32. The curvature radius of the final face of the objective lens 32 on the wafer side is made equal to the distance to an imaging plane 17 of the projection optical system 16 on its wafer side. Thus, reflection light from that final face is directed, as a reference light, to a light receiving surface of a CCD 28 via a mirror 31, the half mirror 10 and a condensing system 27.

On the other hand, the light beam passed through the objective lens 32 is imaged upon a plane 17 corresponding to the wafer surface. Then, it is imaged again by the projection optical system 16 upon a plane 15 corresponding to the reticle pattern. There is a stage 34 on the reticle side, on which a spherical mirror 33 is mounted. The spherical mirror has a curvature radius which is made equal to the distance from the imaging position 15 of the projection optical system, corresponding to the reticle surface. Thus, the light reflected by the spherical mirror 33 is collected again at the imaging position 15 of the projection optical system, corresponding to the reticle surface, and then it goes back through the projection optical system 16. Then, it is directed to the light receiving surface of the CCD 28 via the objective lens 32, the mirror 31, the half mirror 10 and the condensing system 27. The light beam passed through the projection optical system 16 interferes with the reference beam as reflected by the final face of the objective lens 32 as described above, such that the wavefront of the projection optical system 16 can be measured.

Since the detection optical system is provided on the wafer side, by using the movability of the wafer stage in the X and Y directions, measurement can be done with respect to plural points within the picture plane of the exposure region. Thus, with the movement of the wafer stage, the spherical mirror 33 on the reticle side can be moved by the stage 34 to a predetermined position. Therefore, in addition to the wavefront measurement with respect to the individual measurement points, various wavefront aberrations such as distortion and field curvature, for example, of the projection optical system can be detected, by calculation, from the measurement data obtained in relation to the plural points.

For the correction of a system error in the measured wavefront, use of a fringe scan method for enhancement of measurement precision, and calculation of aberrations of the projection optical system may be done in a similar way as in the first embodiment. Also, a modification of using a spherical mirror of a convex surface mirror type on the reticle side, may be made easily. However, in the case of this embodiment, the fringe scan can be accomplished by actuating a PZT device inside the reticle side stage 34 to shift the mirror 33 in the optical axis direction by an amount of about the wavelength, to cause phase modification of the wavefront. Alternatively, the fringe scan may be accomplished by actuating a PZT device inside the wafer stage 19 to move the objective lens 32 in the optical axis direction by an amount of about the wavelength, to cause phase modulation of the wavefront.

On the basis of the results of the measurements, a predetermined lens or lenses of the projection optical system 16 may be displaced, by which the aberrations of the projection optical system can be adjusted and controlled into a desired state.

Figure 5:
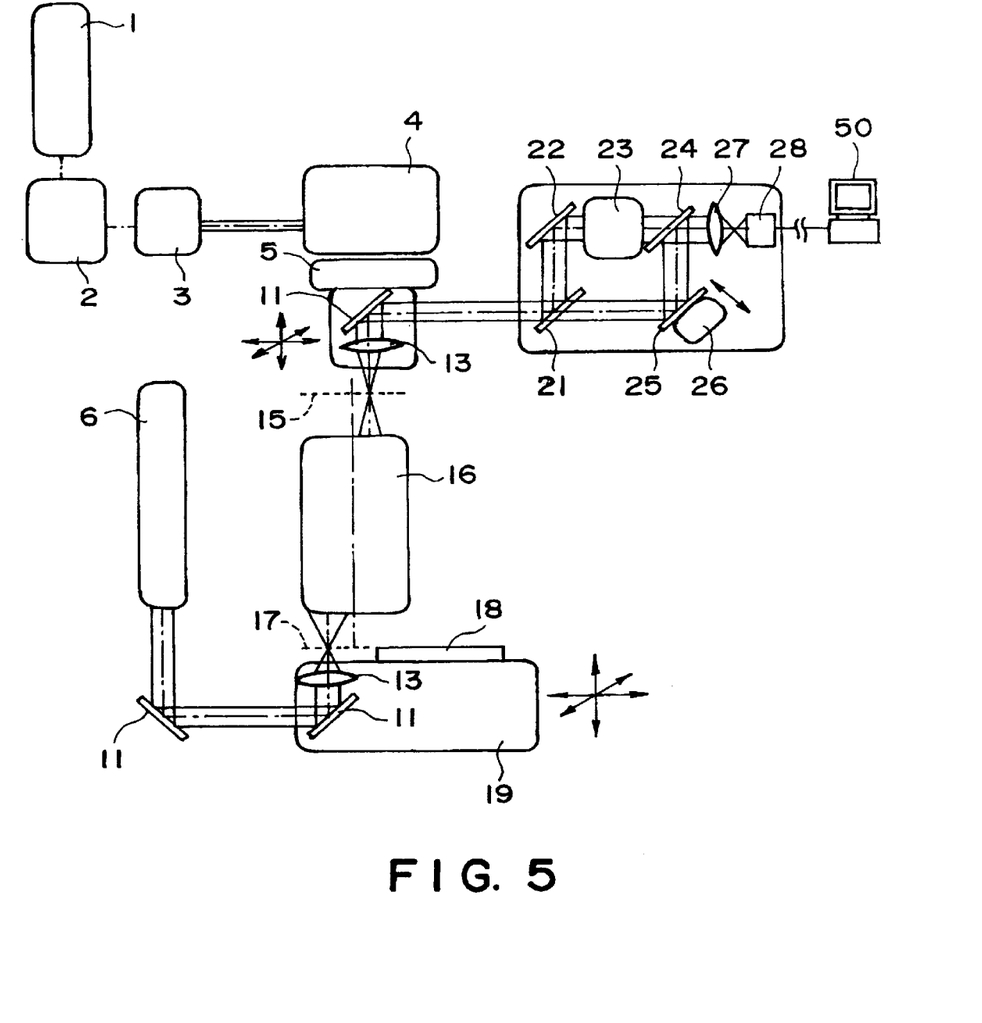
FIG. 5 is a schematic view of a projection exposure apparatus according to a fifth embodiment of the present invention.

FIG. 5 is a schematic view of a fifth embodiment of the present invention. Like the first embodiment, this embodiment is directed to an excimer laser stepper having an exposure wavelength of 248 nm, wherein a single-path type radial share interferometer is provided on the reticle side.

Denoted at 6 is a light source for the interferometer, from which a light beam of 248 nm corresponding to the second harmonic of an Ar laser is extracted. The laser beam goes via a mirror 11 and enters an objective lens 13. The light beam passing through the objective lens 13 is imaged at a position 17 corresponding to the wafer position, and then it is imaged again by the projection optical system 16 at a position 15 on the reticle side. The light thus imaged at the position 15 advances via the objective lens 13, the mirror 11 and a half mirror 10, and it is introduced into an interferometer having components denoted by numerals 21–28.

The light beam introduced into the interferometer is divided by a 1:1 half mirror 21 into two light beams. The reflected light beam goes via a mirror 22 and then it is expanded by a beam expander 23. The expansion magnification may generally be 10× or more. Because of the expansion, the light beam can be considered as being an approximately idealistic plane wave. Thus, as a reference beam, it is directed to a light receiving surface of a CCD 28, via a half mirror 24 and a condensing system 27.

On the other hand, the light beam passed through the half mirror 21 goes via a mirror 25 as a measurement beam, and it is reflected by a half mirror 24, by which it is combined with the reference beam. The light beam is then passed through the condensing system 27 and it is directed onto the light receiving surface of the CCD 28. Here, it is to be noted that, for fine adjustment of the interferometer, the mirror 25 is mounted on a mechanism 26 by which tilt and parallel eccentricity can be adjusted. The measurement beam described above interfere with the reference beam described above, by which the wavefront of the projection optical system 16 can be measured.

The correction of a system error in the measured wavefront as well as calculation of aberrations of the projection optical system, for example, may be done in a similar way as in the first embodiment. On the basis of the results of these measurements, a predetermined lens or lenses of the projection optical system 16 may be displaced, by which the aberrations of the projection optical system can be adjusted and controlled into a desire state.

In a case of an i-line stepper, a basic wave of an argon laser having a wavelength of 363.8 nm may be used.

In the embodiments of the present invention described hereinbefore, an interferometer for measurement of an optical performance of a projection optical system is mounted on a major assembly of a projection exposure apparatus, by which the wavefront measurement for the projection optical system can be performed on the main assembly of the projection exposure apparatus.

Executing the measurement of an optical characteristic of a projection optical system, on the main assembly of a projection exposure apparatus, enables checking the state of the projection optical system as the same is there. It is, therefore, possible to take any necessary measures in accordance with the state of the projection optical system.

More specifically, as an example, the aberration state of the projection optical system can be corrected in accordance with the result of the measurement, or a judgment as to whether the operation should be interrupted or not can be made promptly. As a result of it, the exposure process can be performed with the imaging performance of the projection exposure apparatus held at a high level. This provides a large advantage in the production of semiconductor devices.

While the invention has been described with reference to the structures disclosed herein, it is not confined to the details set forth and this application is intended to cover such modifications or changes as may come within the purposes of the improvements or the scope of the following claims.

What is claimed is:

1. A projection exposure apparatus, comprising:
   an illumination optical system for illuminating a pattern formed on a first object, with exposure light from a light source;
   a projection optical system for directing the exposure light, as emitted from the pattern, onto a second object; and
   an interferometer for measuring an optical characteristic of said projection optical system, said interferometer including a detection optical system for directing light, for interference, to said projection optical system, wherein said detection optical system has an objective lens which is movable between an inside and an outside of a light path for the exposure light.

2. An apparatus according to claim 1, wherein said detection optical system is disposed outside the light path for the exposure light, in an exposure process, and is disposed inside the light path for the exposure light, in a process for measurement of a wavefront.

3. An apparatus according to claim 1, wherein said interferometer uses a light source that is separate from the light source for providing the exposure light.

4. An apparatus according to claim 3, wherein said interferometer is used to measure the optical characteristic at plural points within an exposure region of said projection exposure apparatus.

5. An apparatus according to claim 4, wherein said interferometer is used to measure the optical characteristic at plural points within an exposure region of said projection exposure apparatus and to determine aberration of said projection optical system on the basis of the result of the measurement.

6. An apparatus according to claim 5, wherein said interferometer is used to measure the optical characteristic at plural points within an exposure region of said projection exposure apparatus and to determine a curvature of field of said projection optical system on the basis of the result of the measurement.

7. An apparatus according to claim 6, wherein the curvature of field of said projection optical system is determined on the basis of (i) coordinate positions in an optical axis direction of said detection optical system for wavefront movement, at plural points inside the exposure region, (ii) a wavefront as measured by use of said interferometer, and (iii) a coordinate position of a spherical surface mirror, provided in said interferometer, with respect to the optical axis direction of said projection optical system.

8. An apparatus according to claim 5, wherein light from said projection optical system is reflected by one of a flat mirror and a wafer.

9. A system according to claim 1, wherein distortion of said projection optical system is measured on the basis of measurements made with respect to the plural points.

10. An apparatus according to claim 9, wherein the distortion of said projection optical system is detected on the basis of (i) a coordinate position of said detection optical system of said interferometer with respect to an optical axis direction, upon measurements of a wavefront with respect to said plural points, (ii) the wavefront as measured by said interferometer, and (iii) a coordinate position of a spherical surface mirror, provided in said interferometer, with respect to the optical axis direction of said projection optical system.

11. An apparatus according to claim 1, wherein said interferometer is disposed on a side of said projection optical system, facing the first object.

12. An apparatus according to claim 11, wherein said interferometer includes a spherical surface mirror disposed adjacent to an image plane which is on one side of said projection optical system facing the second object.

13. An apparatus according to claim 12, wherein said spherical surface mirror is mounted on a stage for the second object, being provided in a main system.

14. An apparatus according to claim 13, wherein said spherical surface mirror is made movable along an optical axis direction of said projection optical system, through moving means being provided for focus adjustment of said projection optical system within the main system.

15. An apparatus according to claim 14, further comprising a detection optical system having a TTR alignment scope with an objective lens, being mounted on the main system.

16. A method of manufacturing at least one of a semiconductor device and a liquid crystal display device, said method comprising the steps of:
   preparing a wafer; and
   exposing the wafer by use of a projection exposure apparatus as recited in claim 1.

17. A projection exposure apparatus, comprising:
   an illumination optical system for illuminating a pattern of a first object with exposure light from a light source;
   a projection optical system for directing the exposure light, as emitted from the pattern, to a second object;
   a TTR alignment optical system for performing alignment of the first and second objects, said TTR alignment optical system including an objective lens; and
   an interferometer having a reference surface, said interferometer being arranged to cause interference between first light passed through said objective lens and said projection optical system and second light reflected by the reference surface, thereby to measure an optical characteristic of said projection optical system on the basis of the produced interference.

18. An apparatus according to claim 17, wherein the common objective lens is disposed outside a light path for exposure light, in an exposure process, and inside the light path for exposure light in a process for wavefront measurement.

19. A method of manufacturing at least one of a semiconductor device and a liquid crystal display device, said method comprising the steps of:
   preparing a wafer; and
   exposing the wafer by use of a projection exposure apparatus as recited in claim 17.

20. A projection exposure apparatus, comprising:
   an illumination optical system for illuminating a pattern of a first object with exposure light from a light source;
   a projection optical system for directing the exposure light, as emitted from the pattern, to a second object;

a TTR alignment optical system for performing alignment of the first and second objects, said TTR alignment system including an objective lens; and an interferometer having a reference surface, said interferometer being arranged to cause interference between first light passed through said objective lens and said projection optical system and second light reflected by the reference surface, thereby to measure an optical characteristic of said projection optical system on the basis of the produced interference, wherein said objective lens is movable between an inside and an outside of a light path for the exposure light.

21. A method of manufacturing at least one of a semiconductor device and a liquid crystal display device, said method comprising the steps of:

preparing a wafer; and exposing the wafer by use of a projection optical system as recited in claim 20.

* * * * *

UNITED STATES PATENT AND TRADEMARK OFFICE
CERTIFICATE OF CORRECTION

PATENT NO. : 6,633,362 B2
DATED : October 14, 2003
INVENTOR(S) : Eiichi Murakami et al.

It is certified that error appears in the above-identified patent and that said Letters Patent is hereby corrected as shown below:

Column 6,
Line 58, "interfere" should read -- interferes --.

Column 8,
Line 44, "interfere" should read -- interferes --.

Column 10,
Line 1, "A system" should read -- An apparatus --.

Signed and Sealed this

Seventeenth Day of August, 2004

JON W. DUDAS
*Acting Director of the United States Patent and Trademark Office*